(12) United States Patent
Sadwick et al.

(10) Patent No.: US 9,006,992 B2
(45) Date of Patent: *Apr. 14, 2015

(54) LOW CURRENT THYRISTOR-BASED DIMMING

(75) Inventors: Laurence P. Sadwick, Salt Lake City, UT (US); William B. Sackett, Sandy, UT (US)

(73) Assignee: InnoSys, Inc., Salt Lake City, UT (US)

( * ) Notice: Subject to any disclaimer, the term of this patent is extended or adjusted under 35 U.S.C. 154(b) by 1237 days.

This patent is subject to a terminal disclaimer.

(21) Appl. No.: 12/716,522

(22) Filed: Mar. 3, 2010

(65) Prior Publication Data

US 2010/0259196 A1    Oct. 14, 2010

Related U.S. Application Data

(60) Provisional application No. 61/168,576, filed on Apr. 11, 2009, provisional application No. 61/182,680, filed on May 29, 2009.

(51) Int. Cl.
| H05B 37/02 | (2006.01) |
| H02J 3/14 | (2006.01) |
| H03K 17/72 | (2006.01) |
| H05B 33/08 | (2006.01) |

(52) U.S. Cl.
CPC .............. *H03K 17/72* (2013.01); *Y02B 20/346* (2013.01); *H05B 33/0815* (2013.01)

(58) Field of Classification Search
USPC ......... 315/224, 225, 244, 247, 248, 291, 307, 315/360; 323/222, 282, 283, 284, 285
See application file for complete search history.

(56) References Cited

U.S. PATENT DOCUMENTS

| 7,978,485 B2 | 7/2011 | Stamm et al. | |
| 2004/0135523 A1* | 7/2004 | Takahashi et al. | 315/291 |
| 2007/0182347 A1* | 8/2007 | Shteynberg et al. | 315/312 |
| 2011/0018454 A1* | 1/2011 | Melnyk | 315/224 |

FOREIGN PATENT DOCUMENTS

| GB | 2 435 724 A | 9/2007 |
| JP | 59-205623 A | 11/1984 |
| JP | 07-014271 B2 | 2/1995 |
| JP | 10-023754 A | 1/1998 |
| JP | 10-271828 A | 10/1998 |
| WO | WO 2005/115058 A1 | 12/2005 |

OTHER PUBLICATIONS

OOO Norio and Tobiyo Masahiro, "Thyristor Converter," JPH0714271 (B2) Feb. 15, 1995, (Abstract of JPS60223477 A).*

(Continued)

*Primary Examiner* — Douglas W Owens
*Assistant Examiner* — Thai Pham
(74) *Attorney, Agent, or Firm* — Hamilton DeSanctis & Cha

(57) ABSTRACT

Various apparatuses and methods for starting a thyristor are disclosed herein. For example, some embodiments provide an apparatus for controlling power to a load. The apparatus includes a thyristor, a secondary load switchably connected to an output of the thyristor, and a sensor connected to the secondary load. The sensor is adapted to connect the secondary load to the thyristor when the output of the thyristor falls below a predetermined level.

20 Claims, 18 Drawing Sheets

(56) References Cited

OTHER PUBLICATIONS

Machine Translation of JP, 07-014271, and B (1995) [Full Contents].*

International Search Report for PCT/US2010/030651, mailed Oct. 26, 2010.

Rand D et al: "Issues, Models and Solutions for Triac Modulated Phase Dimming of LED Lamps", Power Electronics Spec. Conf., PESC 2007., pp. 1398-1404.

Extended European Search Report, PCT/US2010/030651, May 9, 2014.

* cited by examiner

US 9,006,992 B2

LOW CURRENT THYRISTOR-BASED DIMMING

CROSS REFERENCE TO RELATED APPLICATIONS

The present application claims priority to U.S. Provisional Patent Application No. 61/168,576 entitled "Low Current TRIAC-Based Dimming", filed Apr. 11, 2009, and to U.S. Provisional Patent Application No. 61/182,680 entitled "Low Current TRIAC-Based Dimming", filed May 29, 2009, the entirety of the aforementioned applications being incorporated herein by reference for all purposes.

BACKGROUND

Dimmers are commonly used in lighting and other applications to control the voltage and/or current level to a load such as a light. Many conventional dimmers use thyristors such as a TRIAC or SCR to control the output voltage and/or current. Typically, the dimmer is designed to turn on only for a portion of each half cycle of an alternating current (AC) power supply. TRIACs may not turn on reliably with non-resistive loads, so replacement of incandescent lights with more energy efficient lights such as light emitting diodes (LEDs) may not always be possible or result in undesirable and/or unacceptable performance with a traditional TRIAC-based dimmer circuit in place. When the load current is low, such as when using an LED light that, for example, uses a switching power supply/driver, the TRIAC in the dimmer may not turn on when intended, or may flicker, flash or otherwise behave in undesirable ways. The need to replace the dimmer when replacing incandescent lights with LEDS can, depending on the situation, be expensive and/or difficult.

Furthermore, thyristors may require a higher starting or trigger current to initially start conducting than the holding current needed to continue conducting once started. In other words, the electrical current through the thyristor may need to initially reach a higher starting current level and can then be reduced to a level at or above the holding current. In practice, this means that a thyristor-based dimmer often has to be turned up to a brighter level to turn on a light, before it can be dimmed down to the desired lower illumination. When a thyristor-based light dimmer is set to a dim level, fluctuations in the supply power can also cause the current through the thyristor to drop below the minimum holding current and turn off the light.

SUMMARY

Various apparatuses and methods for controlling power to a load using a thyristor are disclosed herein. For example, some embodiments provide an apparatus for controlling power to a load. The apparatus includes a thyristor, a secondary load switchably connected to an output of the thyristor, and a sensor connected to the secondary load. The sensor is adapted to connect the secondary load to the thyristor when the output of the thyristor falls below a predetermined level.

In an embodiment of the apparatus for controlling power to a load, the apparatus includes a lamp base, wherein the secondary load and sensor are located within the lamp base.

In an embodiment of the apparatus for controlling power to a load, the secondary load is a resistor having a resistance below about 10 kilohms.

In an embodiment of the apparatus for controlling power to a load, the secondary load is a motor, a fan, an incandescent light, an electrical charger, or an air freshener.

In an embodiment of the apparatus for controlling power to a load, the secondary load is switchably connected to the thyristor output by a transistor.

In an embodiment of the apparatus for controlling power to a load, the sensor includes a resistor connected between the thyristor output and a control input of the transistor, and a second resistor connected between the control input of the transistor and a low voltage reference node, and a Zener diode connected to the control input of the transistor. The sensor also includes a second transistor having an input connected to the control input of the transistor, a third resistor connected between the thyristor output and a control input of the second transistor, and a fourth resistor connected between the control input of the second transistor and the low voltage reference node. The sensor also includes a second Zener diode connected to the control input of the second transistor.

In an embodiment of the apparatus for controlling power to a load, the sensor includes a current sensor connected to the thyristor output, and a comparator having a first input connected to an output of the current sensor, and a second input connected to a reference signal, and an output connected to a control input of the transistor.

An embodiment of the apparatus for controlling power to a load has a delay element connected to the comparator.

In an embodiment of the apparatus for controlling power to a load, the sensor includes a voltage sensor connected to the thyristor output, a current sensor connected to the thyristor output, and a low voltage and low current detector connected to the voltage and current sensors and to a control input of the transistor. The low voltage and low current detector is adapted to connect the secondary load to the thyristor when the thyristor output falls below a threshold voltage level or current level.

An embodiment of the apparatus for controlling power to a load also includes a filter connected to the low voltage and low current detector.

In an embodiment of the apparatus for controlling power to a load, the sensor includes a current monitor connected to the thyristor output and to a control input of the transistor. The current monitor is adapted to connect the secondary load to the thyristor when the thyristor output is within a predetermined current range.

An embodiment of the apparatus for controlling power to a load also includes a transformer having a first winding connected to the thyristor output, and a second winding connected to a primary load output. The sensor includes a current sensor connected to the primary load output. The apparatus also includes a level shifter connected between the current sensor and a control input of the transistor.

An embodiment of the apparatus for controlling power to a load also includes a second current sensor connected to the first transformer winding, with the second current sensor being connected to the control input of the transistor.

Some embodiments also provide a method of controlling power to a load, the method including monitoring an output of a thyristor-based dimmer, determining whether the output meets a predetermined condition, and connecting a secondary load to the output while the output meets the predetermined condition.

In an embodiment of the method, the determining includes identifying when a current level through the output falls below a predetermined level.

An embodiment of the method also includes isolating a primary load output from the dimmer output through a transformer, wherein the determining comprises identifying when a current level through the primary load output falls below a predetermined level. The method also includes level shifting a low current indication signal.

In an embodiment of the method, the determining also includes identifying when a current level through the dimmer output falls below a predetermined level.

In an embodiment of the method, the determining includes identifying when a current level through the output and a voltage level at the output both fall below a predetermined level.

In an embodiment of the method, the determining includes identifying when a current level through the output falls within a predetermined range.

An embodiment of the method also includes disconnecting the secondary load from the output while the output does not meet the predetermined condition.

This summary provides only a general outline of some particular embodiments. Many other objects, features, advantages and other embodiments will become more fully apparent from the following detailed description, the appended claims and the accompanying drawings.

BRIEF DESCRIPTION OF THE DRAWINGS

A further understanding of the various embodiments may be realized by reference to the figures which are described in remaining portions of the specification. In the figures, like reference numerals may be used throughout several drawings to refer to similar components.

DESCRIPTION

The drawings and description, in general, disclose various apparatuses and methods for starting or igniting a thyristor, and various apparatuses and methods for connecting a load across a thyristor-based dimmer to ensure the thyristor operates properly with a primary load that is not purely resistive, both full time and when needed. The apparatuses and methods disclosed herein may thus be adapted to apply a load to a thyristor at startup, or when a sensor detects that it is needed or at all times, or in any combination of these. The term "thyristor" is used herein to refer to a bistable semiconductor device, either bidirectional or unidirectional, that can regulate the output using phase angle control or analogous control schemes, of which a TRIAC (triode for Alternating Current, or bidirectional triode thyristor) and an SCR (silicon-controlled rectifier) are particular non-limiting examples. The term "starting circuit" is used herein to refer to a circuit that temporarily applies a load to the thyristor to help ensure that the current through the thyristor reaches the minimum starting current. The load is disconnected from the thyristor by the starting circuit after a predetermined amount of time, or when a voltage or current level in the system reaches a predetermined level, or based on any other suitable sensor measurement or control system determination. Note that the starting circuit may be applied when the thyristor-based dimmer is first turned on, or at any time during operation of the thyristor-based dimmer as needed to enable low-current thyristor based dimming. The circuits disclosed herein are also operational when no dimmer is in place, that is, they do not impede the normal functioning of typical loads or driver circuits if used without a dimmer.

Figure 1:
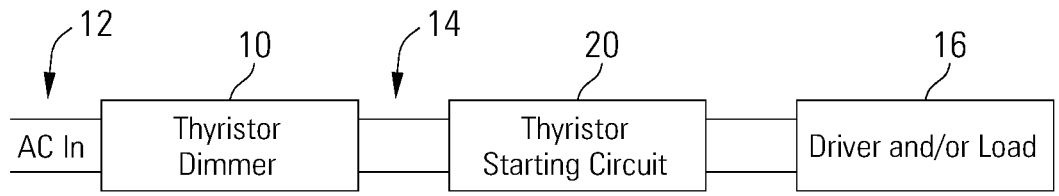
FIG. 1 is a block diagram of a system using a thyristor starting circuit.
Figure 2:
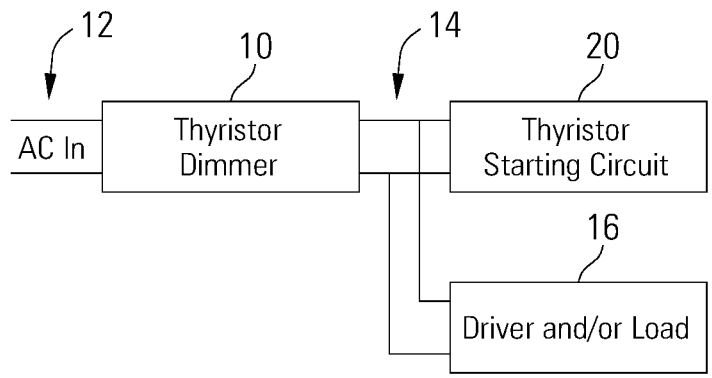
FIG. 2 is a block diagram of a system using a thyristor starting circuit.
Figure 3:
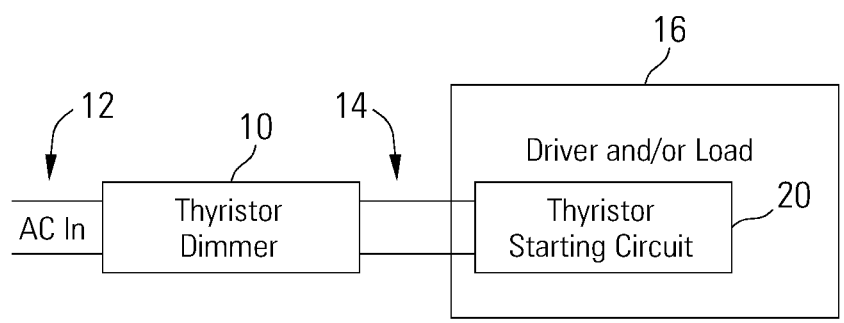
FIG. 3 is a block diagram of a system using a thyristor starting circuit.

Referring now to FIG. 1, a block diagram of a system using a thyristor starting circuit is illustrated. A thyristor-based dimmer 10 is connected to an AC (alternating current) input 12 such as a standard 110V residential power outlet. The thyristor-based dimmer 10 is designed to reduce the voltage at the output 14, for example by chopping or turning off the output voltage for a portion of every cycle on the input voltage waveform. The thyristor-based dimmer 10 may include a knob, slider or other control allowing a user to select the desired output level. In conventional applications, the output 14 of the thyristor-based dimmer 10 is connected directly to one or more lights 16, enabling the user to select the desired illumination level of the lights. The thyristor-based dimmer 10 may also be connected to other types of loads 16 or to driver circuits for other types of lights, such as LEDs or fluorescent lamps. However, as discussed above, the thyristor in the thyristor-based dimmer 10 may not operate properly with loads 16 that are non-resistive, or with resistive loads when the dimmer is operated at very low levels. The thyristor starting circuit 20 is connected to the thyristor-based dimmer 10 to apply a resistive or other suitable load to the thyristor in the thyristor-based dimmer 10 to enable proper operation. The thyristor starting circuit 20 may be connected in series between the thyristor-based dimmer 10 and the load 16, as illustrated in FIG. 1. In other embodiments, the thyristor starting circuit 20 may be connected to the thyristor-based dimmer 10 in parallel with the load 16, as illustrated in FIG. 2. The thyristor starting circuit 20 may also be integrated into a driver circuit 16 as illustrated in FIG. 3. Although FIGS. 1-3 show both lines of the AC input 12 going through the thyristor-based dimmer 10, the thyristor-based dimmer 10 may be placed in series in one lead of the AC input 12.

Figure 4:
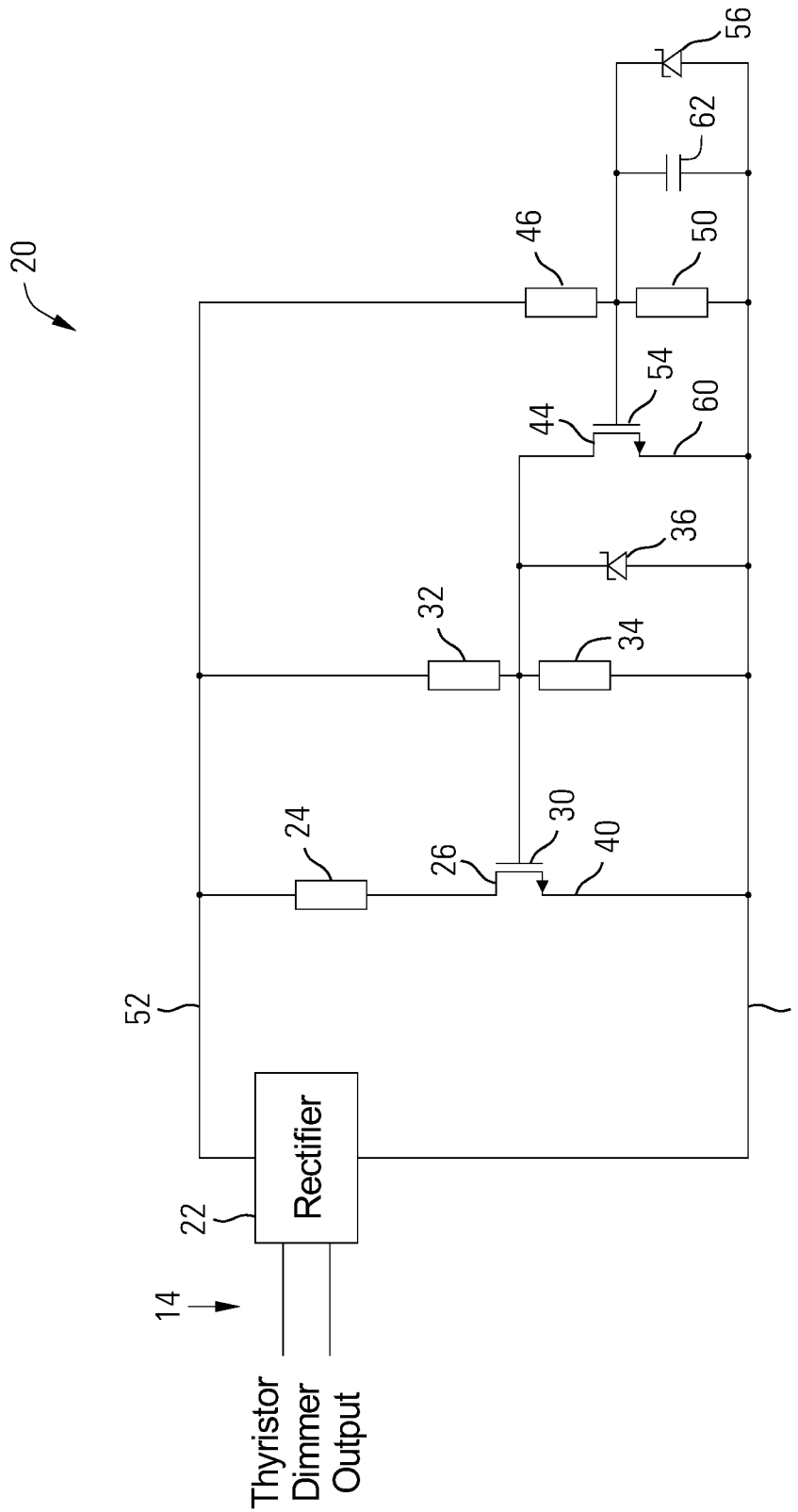
FIG. 4 is a schematic illustration of a thyristor starting circuit using an RC time constant delay with full-rectifier connection.

Referring now to FIG. 4, the thyristor starting circuit 20 may be connected to the output 14 of the thyristor-based dimmer 10 through a rectifier 22 to protect the thyristor starting circuit 20 from the negative voltage half-cycles from the thyristor-based dimmer 10. The rectifier 22 may comprise any suitable device for rectifying the voltage at the output 14 of the thyristor-based dimmer 10, such as a diode bridge. Additional filtering components such as a capacitor (not shown) may be connected if desired across the rectifier 22.

A load 24 is switchably connected across the thyristor dimmer output 14 through the rectifier 22. For example, a switch 26 such as a transistor may be connected in series with the load 24 across the thyristor dimmer output 14. The switch 26 may comprise an N-channel metal-oxide-semiconductor field-effect transistor (MOSFET), a bipolar junction transistor (BJT) or any other suitable switching device made from silicon (Si), gallium arsenide (GaAs), silicon carbide (SiC), gallium nitride (GaN) or any other suitable material. When the switch 26 is closed the load 24 is connected to the thyristor-based dimmer 10, and when the switch 26 is open the load 24 is disconnected from the thyristor-based dimmer 10. The load 24 may comprise a simple resistor or any other suitable load to cause the thyristor to fire correctly. The load 24 may also be a device that performs a useful function when connected, such as a small incandescent light, a heater, etc. The load 24 is also referred to herein as a secondary load, to distinguish it from the primary load such as an LED or other type of light or non-resistive light powered by the dimmer. In general, the lower the resistance of the secondary load 24, the more readily the thyristor will fire, as current through the thyristor is increased with the lower resistance of the load 24. It is important to note that the term primary load and secondary load is not related to the primary and secondary windings of transformers used in some embodiments disclosed herein. Thus, for example, the term primary load is no indication of connection to either a primary winding or secondary winding of a transformer also used in the circuit.

The transistor used as switch 26 should be rated to handle at least the peak voltage that appears across the thyristor dimmer output 14. The gate 30 of the switch 26 is powered, for example, by a pair of resistors 32 and 34 connected between the supply node 52 and the return node 42. The gate 30 may also be protected by a Zener diode 36 or other voltage limiting device or circuit, connected between the gate 30 and source 40, which is connected to the return node 42. The Zener diode 36 should be selected to keep the gate to source voltage on the switch 26 at or below its maximum rated $V_{GS}$.

The switch 26 is controlled by a second switch 44 connected between the gate 30 of the switch 26 and the return node 42. The second switch 44 may also comprise an N-channel MOSFET transistor or any other suitable type of switching device. When the switch 44 is off, the gate 30 of the switch 26 is pulled up by resistors 32 and 34, turning on the switch 26 and connecting the load 24 to the thyristor-based dimmer 10. When the second switch 44 is on, the gate 30 of the switch 26 is pulled down through the second switch 44, turning off the switch 26 and disconnecting the load 24 from the thyristor-based dimmer 10.

The second switch 44 may be controlled by a number of various controllers. In the embodiment of FIG. 4, an RC circuit is used to control the second switch 44. A pair of resistors 46 and 50 is connected between the supply node 52 and return node 42, with the common node connected to the gate 54 of the second switch 44. The values of the resistors 46 and 50 are selected to safely turn on the second switch 44 when the supply node 52 is at full power. Note that the second switch 44 only needs a $V_{DS}$ voltage rating equal to the maximum gate voltage of the switch 26 as set by the Zener diode 36. The gate 54 of the second switch 44 is protected by a Zener diode 56 or other voltage limiter, connected between the gate 54 and source 60 of the second switch 44. A capacitor 62 is also connected between the gate 54 and source 60 of the second switch 44 so that the voltage at the gate 54 gradually rises to a level set by the resistors 46 and 50 and the Zener diode 56 when power is first applied to the system.

Values for the resistors 46 and 50 and the capacitor 62 are selected to provide the desired RC time constant such that the load 24 is connected to the thyristor-based dimmer 10 for the desired amount of time. This amount of time may be based on the characteristics of the particular thyristor in the thyristor-based dimmer 10, the characteristics of the load 16, the voltage level and stability of the AC input 12 and other factors. A relatively long or conservative amount of time may be selected to ensure that the thyristor will fire in all circumstances, although in ideal conditions the load 24 may be applied longer than needed, using a small amount of extra power. For example, if the time constant is adapted to connect the load 24 for a half second or even a few seconds, 60 to 240 half cycles will have reached the thyristor with the load 24 applied. A shorter amount of time may be selected to minimize that power usage, at the risk of not firing the first time in particularly poor environments. For example, the time constant may be adapted to connect the load 24 to the thyristor-based dimmer 10 for a smaller number of half cycles, such as 10 or 30. (Again, these time constants are merely examples and should not be viewed as limiting.)

The secondary load 24 may comprise a low value resistor such as a 500Ω or a 1 kΩ resistor or higher or lower as needed or desired. The resistors (e.g., 32 and 34, 46 and 50) may comprise any circuit or device suitable for providing reference voltages, such as resistive voltage dividers, capacitive or inductive voltage dividers, RC networks, bandgap reference voltage circuits, etc. For example, in one embodiment, the resistors 32 and 34, 46 and 50 have relatively high values to limit current drain on the rectified input 52. The switches 26 and 44 may be any suitable type of transistors, such as N-channel or P-channel field effect transistors, enhancement or depletion mode transistors, bipolar transistors, etc, made from any type of material including those based on silicon, gallium arsenide, gallium nitride, silicon carbide, silicon on insulator (SOI), silicon on sapphire (SOS), etc., with the logic of the thyristor starting circuit 20 adapted accordingly to connect the secondary load 24 across the thyristor dimmer output 14 when the rectified input at the supply node 52 is at a low voltage level or low current level or in any other state that would suggest that a thyristor in the thyristor-based dimmer 10 may benefit from the application of the secondary load 24.

Figure 5:
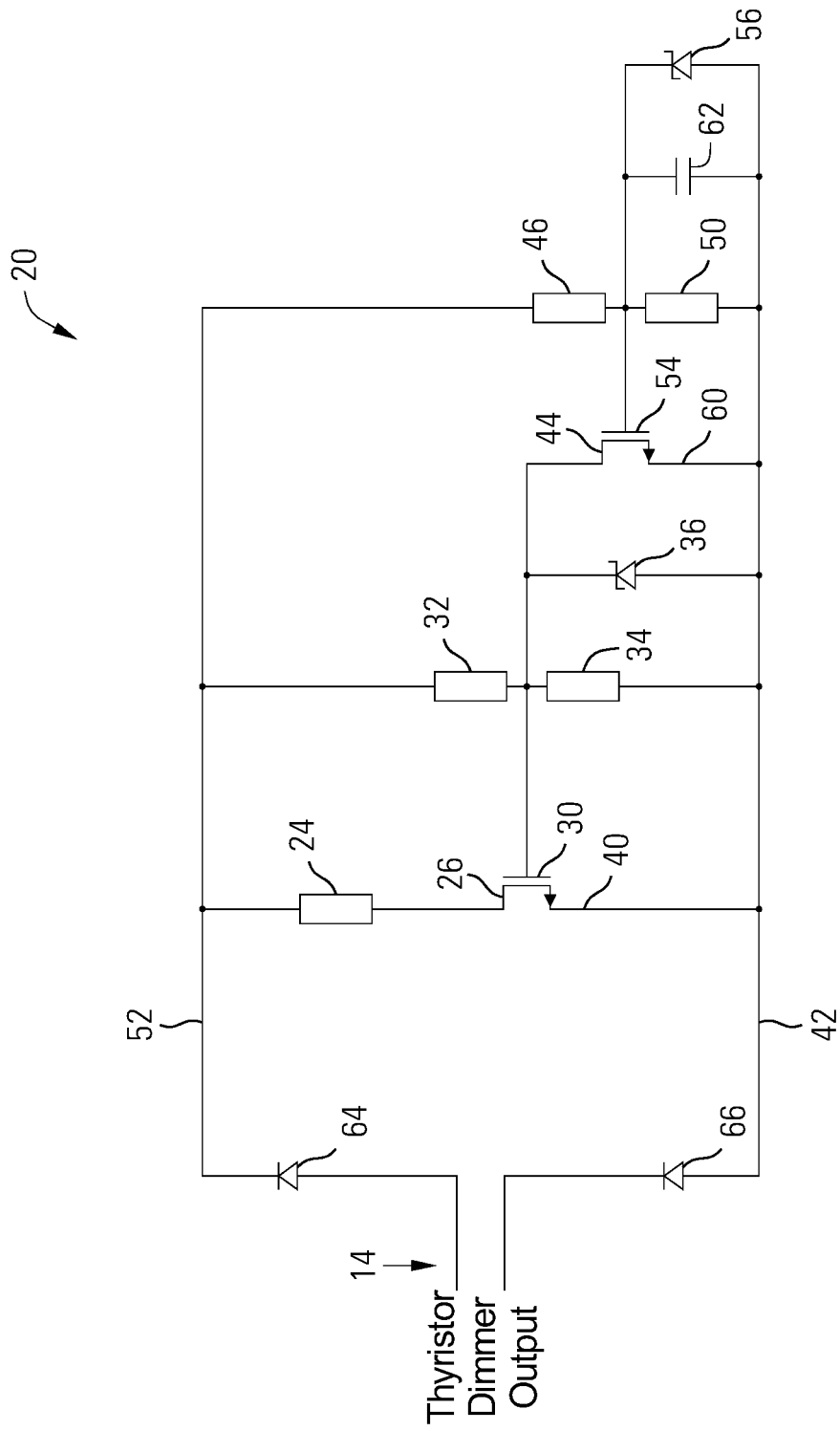
FIG. 5 is a schematic illustration of a thyristor starting circuit using an RC time constant delay with half-rectifier connection.

As illustrated in FIG. 5, the thyristor starting circuit 20 may alternatively include a half bridge rectifier comprising two diodes 64 and 66, both oriented in the same direction in the thyristor starting circuit 20 so that the load 24 is applied to thyristor-based dimmer 10 only in the positive half of every cycle at the AC input 12.

Figure 6:
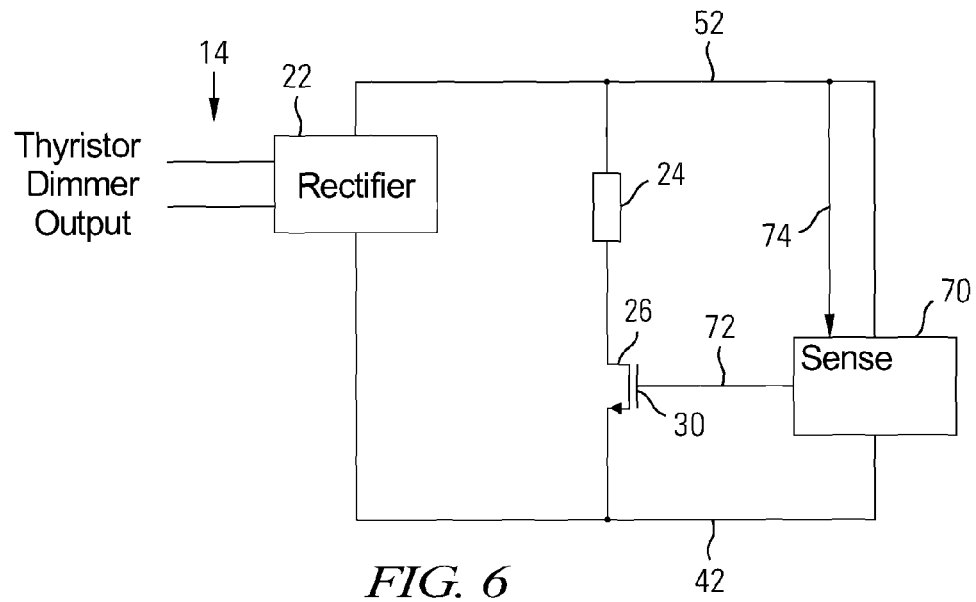
FIG. 6 is a schematic illustration of a thyristor starting circuit and/or controlled thyristor load circuit with sensing controller.

Referring now to FIG. 6, a sensor circuit 70 may be used to control the switch 26 to connect and disconnect the load 24 with the thyristor-based dimmer 10. The sensor circuit 70 may be powered for example by the thyristor dimmer output 14 via the supply node 52 and return node 42. The sensor circuit 70 has a control output 72 connected to the transistor gate 30 to control the switch 26. A sense signal 74 is used by the sensor circuit 70 to determine whether the load 24 should be connected or disconnected. The sensor circuit 70 may be adapted for use with any of a variety of sense signals 74. For example, the sense signal 74 may be used to determine the voltage and/or current through the thyristor-based dimmer 10. In this case, the sensor circuit 70 is adapted to close the switch 26 and connect the load 24 when a low voltage and/or current is detected through the thyristor-based dimmer 10. The sensor circuit 70 may be adapted in various non-limiting embodiments to use Boolean Algebra (i.e., NAND, NOR, AND, OR, Exclusive OR, etc.) circuits, digital logic, including inverters, comparators, flip flops, counters, one shots, state machines, FPGAs, microcontrollers, microprocessors, etc., analog circuits such as op amps, current mirrors, time constants, integrators, voltage to frequency and/or frequency to voltage converters, analog to digital converters, digital to analog converters, multipliers, log and antilog circuits, analog muxes, mixed signal circuits, etc. in any combination or form, in conjunction with one or more sensing inputs (e.g., 74).

In one embodiment, the sensor circuit 70 includes a microcontroller or other logic that only connects the load 24 if the dimmer 10 is active, for example by measuring the average voltage and allowing the load 24 to be connected only if the average voltage is less than the average voltage expected on the AC line 12, or by measuring the duty cycle of the waveform at the thyristor dimmer output 14 to determine whether it has been chopped by an active thyristor-based dimmer 10.

Figure 7:
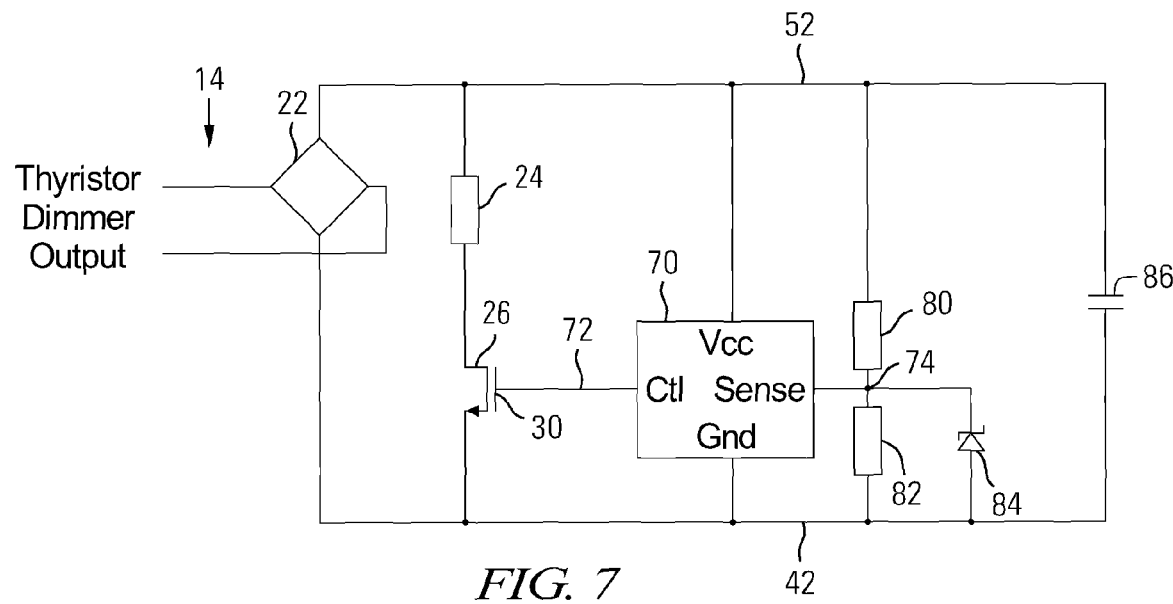
FIG. 7 is a schematic illustration of a thyristor starting circuit and/or controlled thyristor load circuit with sensing controller.
Figure 8:
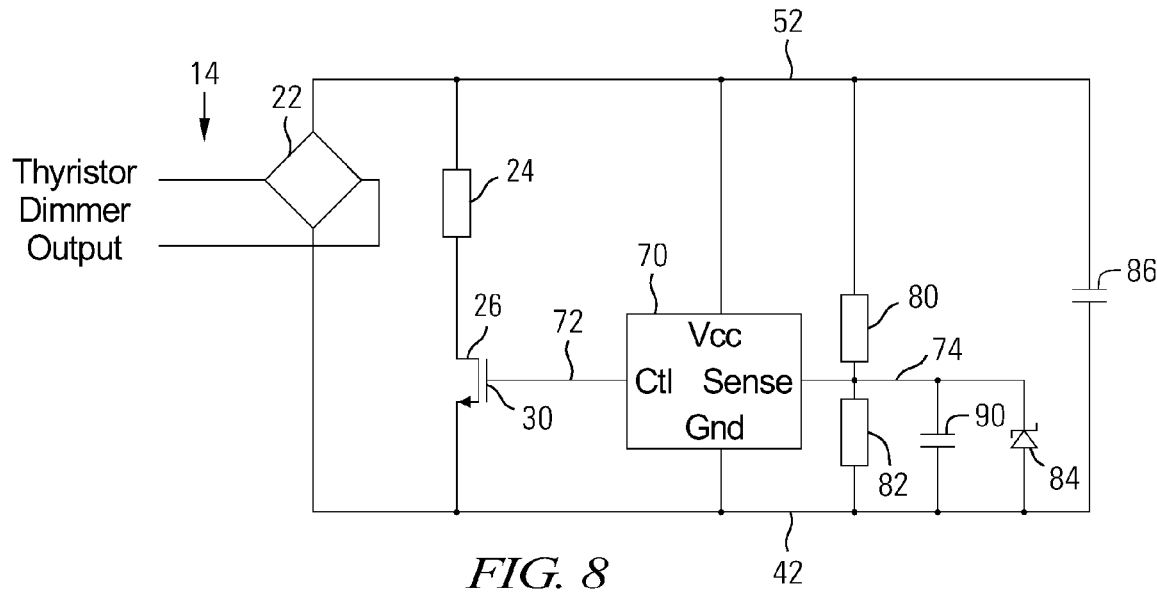
FIG. 8 is a schematic illustration of a thyristor starting circuit and/or controlled thyristor load circuit with sensing controller.

As illustrated in FIG. 7, the sense signal 74 may be scaled by a voltage divider 80 and 82 if desired. For example, the resistors 80 and 82 may be connected in series between the supply node 52 and return node 42. A Zener diode 84 may be used to limit the voltage at the sense input of the sensor circuit 70. The rectified voltage across the supply node 52 and return node 42 may be filtered by a capacitor 86. A time constant may be applied to the sense signal 74 as illustrated in FIG. 8 by a capacitor 90 operating in conjunction with the resistors 80 and 82 to ensure that the load 24 remains connected to the thyristor-based dimmer 10 for at least some time duration.

Figure 9:
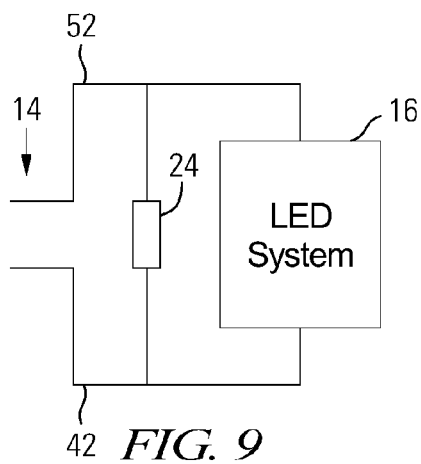
FIG. 9 illustrates a resistive load connected in parallel with an LED power supply, driver or other system.
Figure 10:
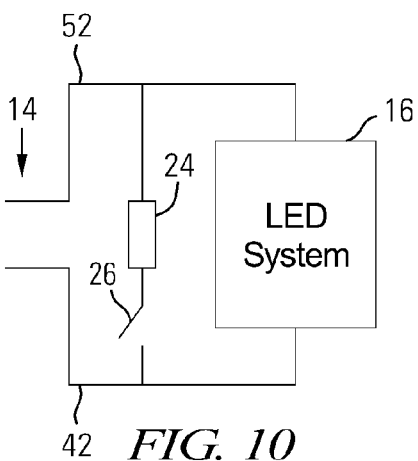
FIG. 10 illustrates a switched resistive load switchably connected in parallel with an LED power supply, driver or other system.

Referring now to FIG. 9, a load 10 may also be connected across a thyristor-based dimmer 10 full time to ensure that the thyristor operates properly with a primary load 16 that is not purely resistive, such as a system of LEDs and/or LED driver circuits. The load 16 may also comprise any circuit suitable for powering an LED light from the AC input 12. For example, given an AC voltage input 12 of about 110V that has been phase chopped by the thyristor-based dimmer 10, the LED power supply 16 may comprise a rectifier and current regulator to provide a low DC current as needed to power an LED light. The load 24 may comprise a small resistive load such as a resistor, an incandescent light, a fan, etc. The load 24 may alternatively be switchably connected across the thyristor dimmer output 14 in parallel with the load 16, as illustrated in FIG. 10 and described above. The switch 26 may be controlled by a pulse signal or by a current or voltage sensing circuit, turning on when the current or voltage through the LED power supply or from the dimmer is at a low level.

Figure 11:
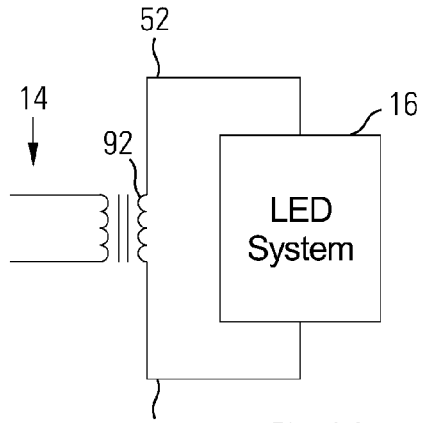
FIG. 11 illustrates an LED power supply, driver or other system as it may be connected through a transformer to a dimmer.

Referring now to FIG. 11, the system may comprise a transformer 92 between the thyristor-based dimmer 10 and the load 16, with the transformer 92 applying enough of a resistive load to the thyristor-based dimmer 10 so that the thyristor in the dimmer 10 functions properly.

Figure 12:
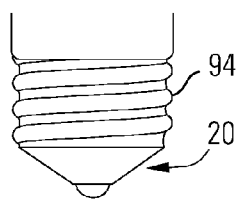
FIG. 12 illustrates a light socket adapter with a resistive load in the base.

The circuits described herein (e.g., 20), including in various embodiments a resistive load, sensing and switching circuits, may be placed in an adapter 94 for an Edison light socket or lamp base, such as an E26, E27, GU-10, MR16, PAR30, etc. as illustrated in FIG. 12. The resistive load inside the adapter is connected in parallel with the load, and may have a fixed or variable resistance, and may be switched or full-time.

The resistive load placed in parallel with the LED light or power supply may be any small resistive load, applying for example a 4 watt load at 115-125V, which would have a resistance of about 1-2 kohm. The small resistive load may be a simple resistor dissipating electrical energy through heat, or may be a device that performs some useful function while providing enough of a resistive load for the thyristor in a dimmer 10. For example, a small incandescent light such as a nightlight may be used for the resistive load in parallel with an LED lighting system. The incandescent light may be shielded and hidden, or may be coverable by the consumer or end user, or may be left visible to contribute to the overall illumination. If left visible, the color of the incandescent light may be adjusted using a colored filter adjacent the light. A glass or plastic window may partially or totally enclose the incandescent light. Other examples of useful functions that may be performed while adding a resistive load include a charger for an electrical storage device such as a battery charger or cell phone charger, a fan, an ionizing air freshener, etc.

The system disclosed herein for adding a resistive load in parallel with an LED lighting system may comprise adding one resistive load 24 per LED lighting system or one resistive load in parallel with multiple parallel loads. For example, given 200 1 W or 2 W LED lamps across a dimmer 10, only one parallel resistive load 24 is needed across the dimmer 10. This enables the user to include a single thyristor starting circuit 20 or parallel load 24 in a lamp base adapter 94 in one socket of a chandelier, with LED drivers and/or lights connected to all of the other sockets. The single thyristor starting circuit 20 or parallel load 24 enables the thyristor-based dimmer 10 operating the chandelier to function properly for all of the LED drivers and lights.

Figure 13:
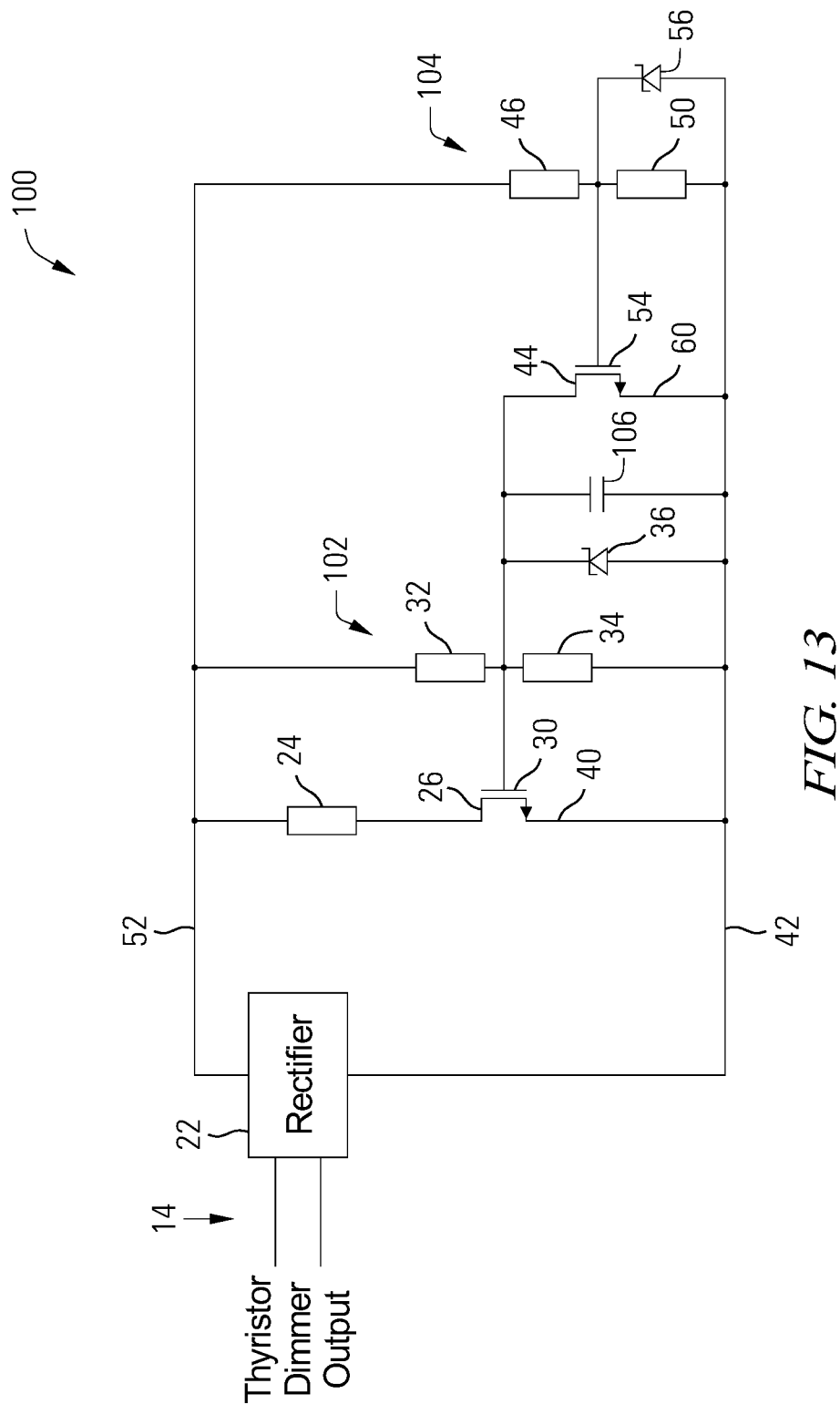
FIG. 13 is a schematic illustration of a thyristor starting circuit and/or controlled thyristor load circuit.

Referring now to FIG. 13, a load circuit 100 for low current thyristor-based dimming may be sensor-based to apply the load 24 across the thyristor dimmer output 14 whenever the supply node 52 falls below a predetermined threshold voltage. The AC output 14 of the dimmer is rectified in a rectifier 22. A transistor is used as a switch 26 to apply the load 24 across the thyristor dimmer output 14, either in a digital on/off fashion or in an analog fashion. The gate 30 of the transistor 26 is powered by a pair 102 of resistors 32 and 34 based on the rectified input 52, or by a network of capacitors, or any other suitable voltage supply. The gate 30 of the transistor 26 may be protected from high voltages from the pair 102 of resistors by a Zener diode 36 or other voltage-limiting device or circuit. The transistor 26 is controlled by another switch or transistor 44, also biased by a pair 104 of resistors 46 and 50 from the rectified input 52 and protected and assisted by a Zener diode 56. The time needed to turn on the switch 26 and apply the load 24 can be controlled by a time constant, for example by including a capacitor 106 between the gate 30 and return node 42, in this embodiment and in other embodiments discussed herein or in variations thereof. Time constants, filters or delays may be added in any other suitable manner as well, including analog methods and digital methods such as a digital delay.

The control transistor 44 is biased by the pair 104 of resistors 46 and 50 such that it is off at low voltages on the rectified input 52 and on when the rectified input 52 reaches a predetermined voltage level and above. The switching transistor 26 is biased by the pair 102 of resistors 32 and 34 such that it would normally be on across the expected operating voltage ranges for the rectified input 52. However, when the voltage at the dimmer output 14 and the rectified input 52 is high, the control transistor 44 is on, shorting the gate of the switching transistor 26 down and turning off the switching transistor 26. This isolates the secondary load 24 so that it does not appear across the dimmer output 14. When the voltage at the dimmer output 14 and the rectified input 52 is low, the control transistor 44 is off, allowing the gate of the switching transistor 26 to be biased up by the pair 102 of resistors 32 and 34 and turning on the switching transistor 26. This connects the secondary load 24 across the dimmer output 14. Note that the resistors 32, 34, 46 and 50 are selected such that the second switch 44 is biased off and the switch 26 is biased on when the supply node 52 is at a low voltage. This low voltage appears at the supply node 52 when power is applied to the dimmer circuit but when the thyristor-based dimmer 10 potentially requires the secondary load 24 to operate properly. The range of voltages in which the load 24 should be applied may vary widely in different circumstances, depending on the line voltage, the design of the thyristor-based dimmer 10, various types of loads, etc, and specific voltage ranges are therefore not given herein. By switchably connecting the secondary load 24 across the thyristor-based dimmer 10 at low voltage levels, the dimmer 10 operates reliably at low currents or loads.

Figure 14:
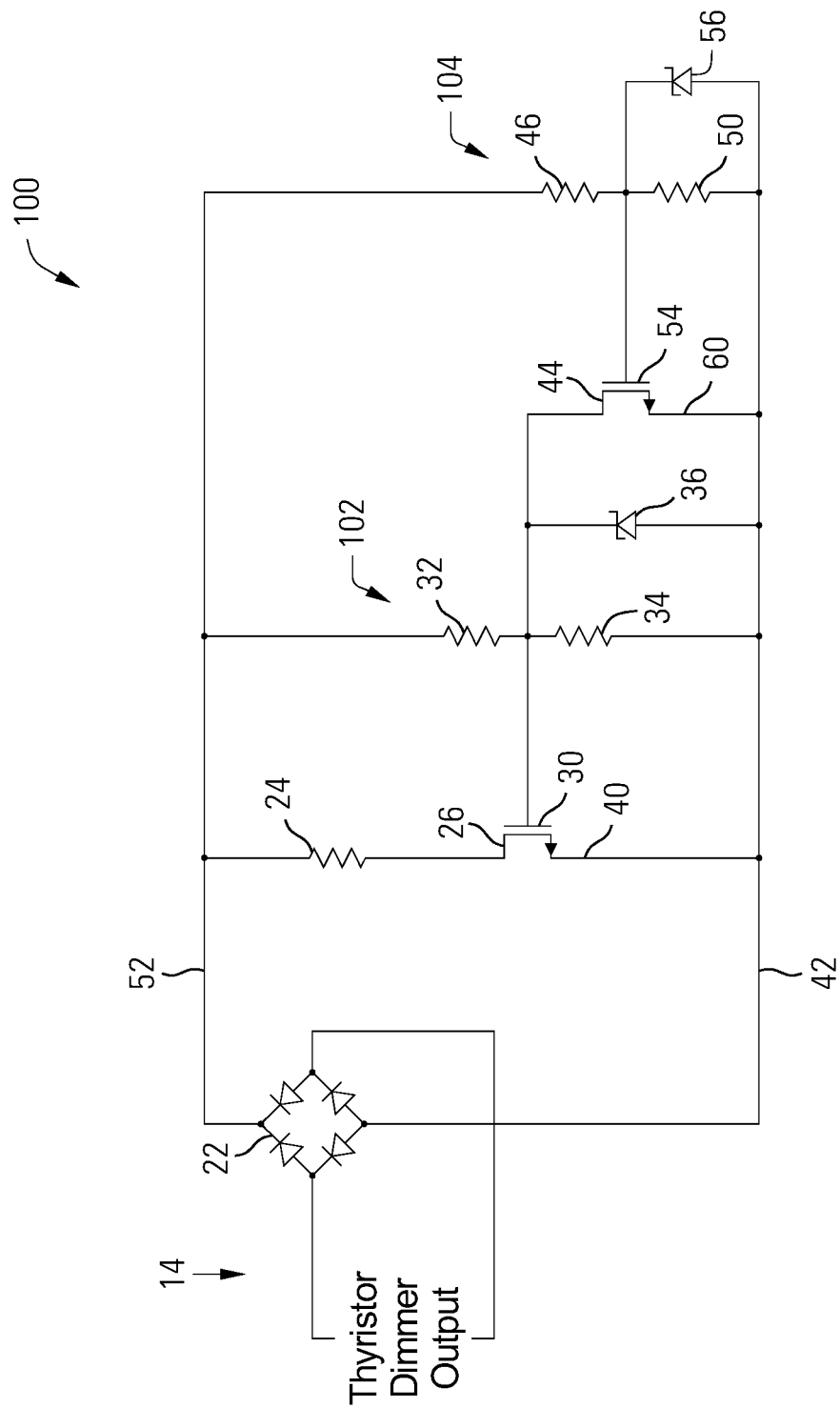
FIG. 14 is a schematic illustration of a thyristor starting circuit and/or controlled thyristor load circuit.

Turning now to FIG. 14, in one embodiment the rectifier 22 may comprise a diode bridge or any other suitable circuit or device to rectify the AC output 14 of a dimmer 10. The secondary load 24 may comprise a low value resistor such as a 500Ω or a 1 kΩ resistor or higher or lower as needed or desired. The resistors 32, 34, 46 and 50 and Zener diodes 36 and 56 may comprise any circuit or device suitable for providing reference voltages, such as resistive voltage dividers, capacitive or inductive voltage dividers, RC networks, bandgap reference voltage circuits, etc. For example, in one embodiment, the resistors 32, 34, 46 and 50 comprise resistors of relatively high values to limit current drain on the rectified input 52 through the resistors 32, 34, 46 and 50. The transistors 26 and 44 may be any suitable type of transistors, such as N-channel or P-channel field effect transistors, enhancement or depletion mode transistors, bipolar transistors, etc, made from any type of material including those based on silicon, gallium arsenide, gallium nitride, silicon carbide, silicon on insulator (SOI), silicon on sapphire (SOS), etc., with the logic of the circuit adapted accordingly to connect the secondary load 24 across the dimmer output 14 when the rectified input 52 is at a low voltage level or low current level or in any other state that would suggest that a thyristor such as a TRIAC or SCR in the dimmer 10 may benefit from the application of the secondary load 24.

Figure 15:
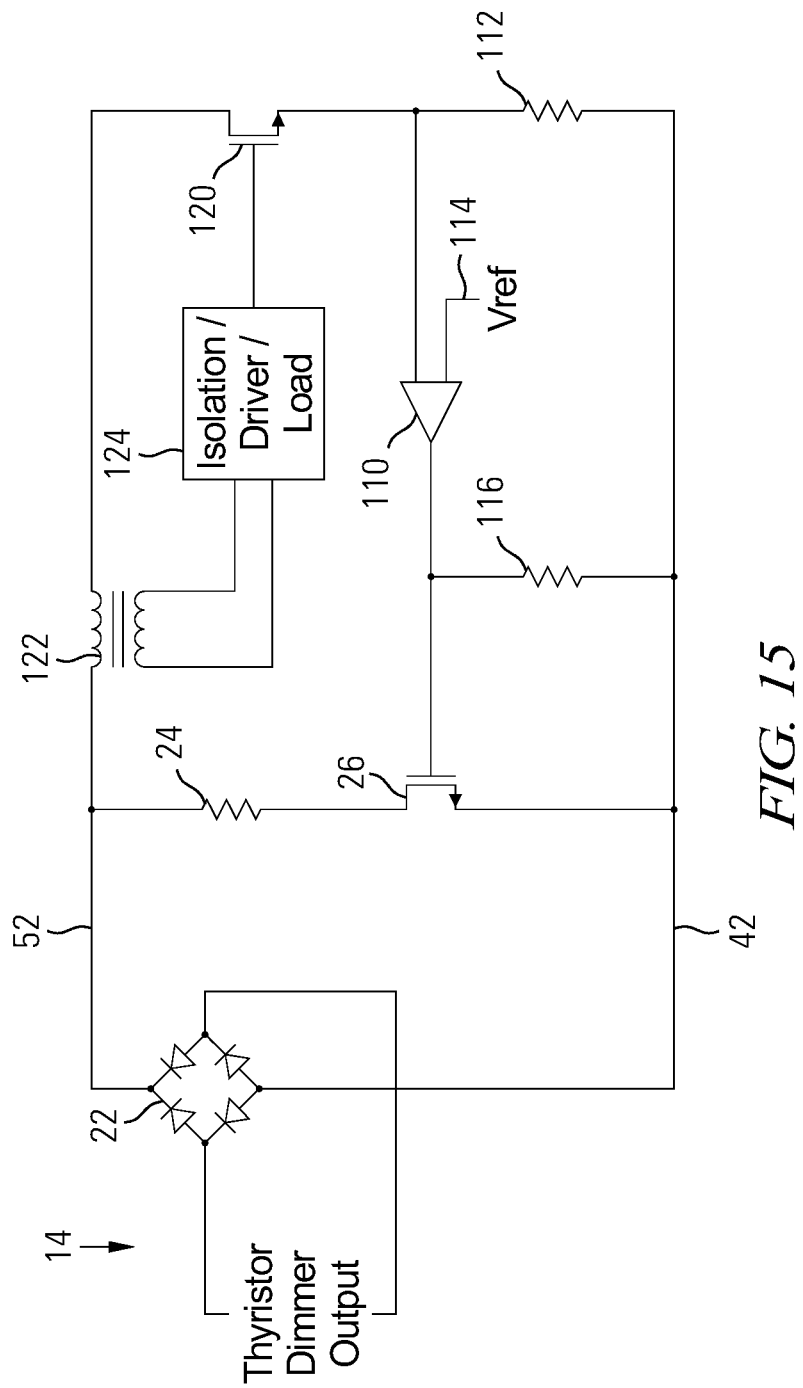
FIG. 15 is a schematic illustration of a thyristor starting circuit and/or controlled thyristor load circuit with transformer-connected control.

Turning now to FIG. 15, the transistor 26 switching the secondary load 24 may be controlled by an operational amplifier (op-amp) or comparator 110 rather than the control transistor 44 and resistors 46 and 50. In this embodiment, the current through the rectified input 52 is detected using a device such as a sense resistor 112. The sense resistor can be located anywhere in the input current path with one location being below the primary switching transistor 120 as shown, for example, in FIG. 15 although anywhere else in the input current path could also be used and sensed from the other chosen position(s). When the current is lower than a predetermined threshold established by a reference voltage 114, the comparator 110 turns on the transistor 26 to connect the secondary load 24. A resistor 116 may be included to pull down the gate of the transistor 26 to ensure that it turns off when the output of the comparator 110 is off. As discussed above, the secondary load 24 may be switched based on a determination of low current through the dimmer output 14, low voltage, or any other suitable state indicator. The use in various non-limiting embodiments of Boolean Algebra (i.e., NAND, NOR, AND, OR, Exclusive OR, etc.) circuits, digital logic, including inverters, comparators, flip flops, counters, one shots, state machines, FPGAs, microcontrollers, microprocessors, etc., analog circuits such as op amps, current mirrors, time constants, integrators, voltage to frequency and/or frequency to voltage converters, analog to digital converters, digital to analog converters, multipliers, log and antilog circuits, analog muxes, etc., mixed signal circuits, etc. in any combination or form may be used in conjunction with one or more sensing inputs, nodes, etc. For example, an OR gate could be used to sense when the inputs detect either too low of a voltage or too low of a current and respond appropriately. In another example, an AND gate can be used to sense too low of a current and too low of a voltage. It should be understood that there are numerous and diverse ways to apply such Boolean Algebra, digital logic, analog and digital circuits, FPGAs, etc. to the present invention and all of these numerous and diverse approaches, methods, circuits, etc. are understood to be part of and incorporated into the present invention herein.

Although the circuit enabling low current or low voltage is not limited to any particular primary load, load driving circuit, or load placement, one example is illustrated in FIG. 15. In this example, a switching transistor 120 turns current through a transformer 122 on and off. Current is supplied to a primary load 124 by the secondary winding of the transformer 122. A control circuit and driver for the transistor 120 may also be connected between the transformer 122 and transistor 120. Portions of the control circuit and driver may be referenced to the primary or secondary winding of the transformer 122 as desired, with isolation circuitry used between the secondary of the transformer 122 and the transistor 120 to make the transition between primary-referenced circuitry and secondary-referenced circuitry.

Figure 16:
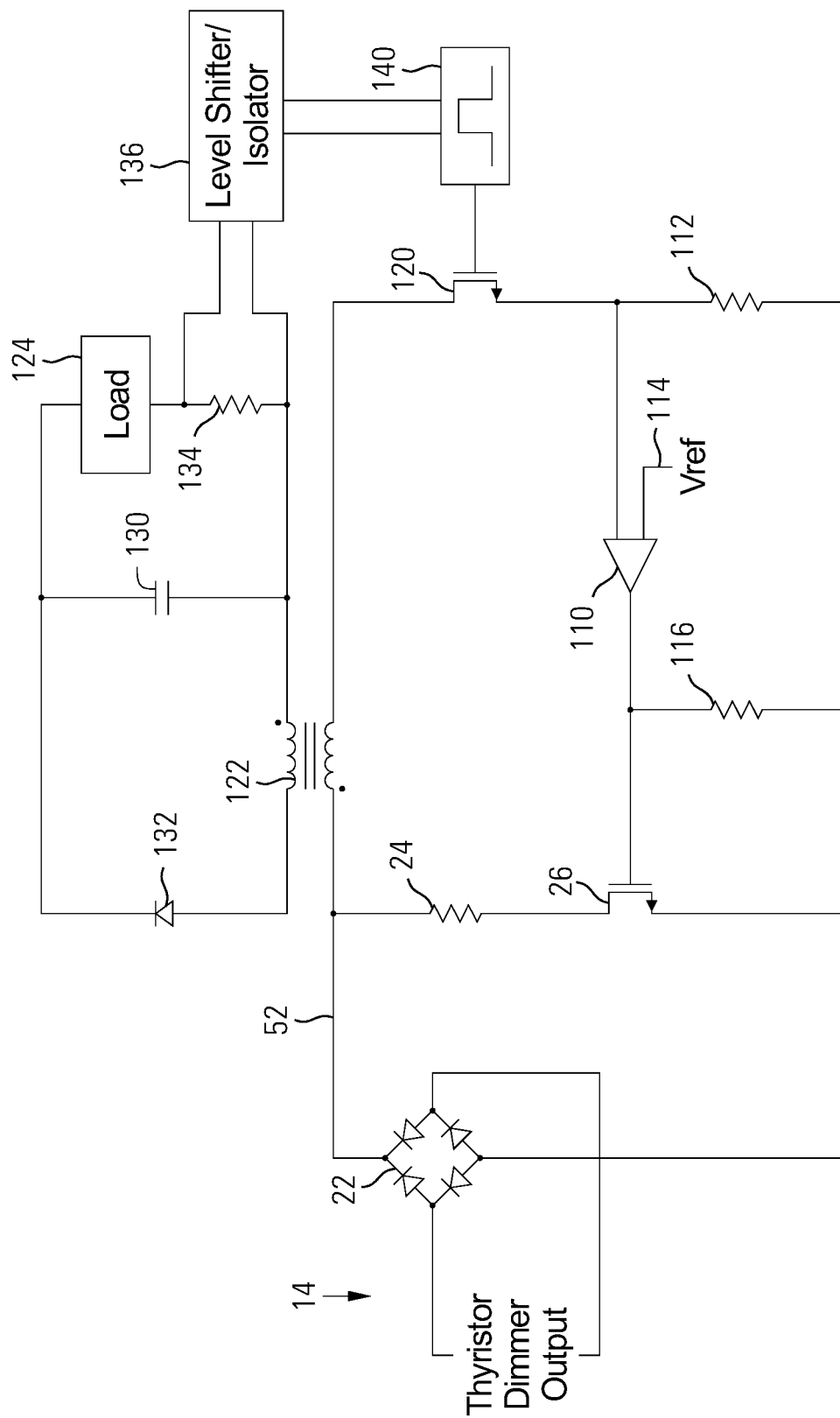
FIG. 16 is a schematic illustration of a thyristor starting circuit and/or controlled thyristor load circuit controlled via reference voltage and with a transformer-connected load.
Figure 17:
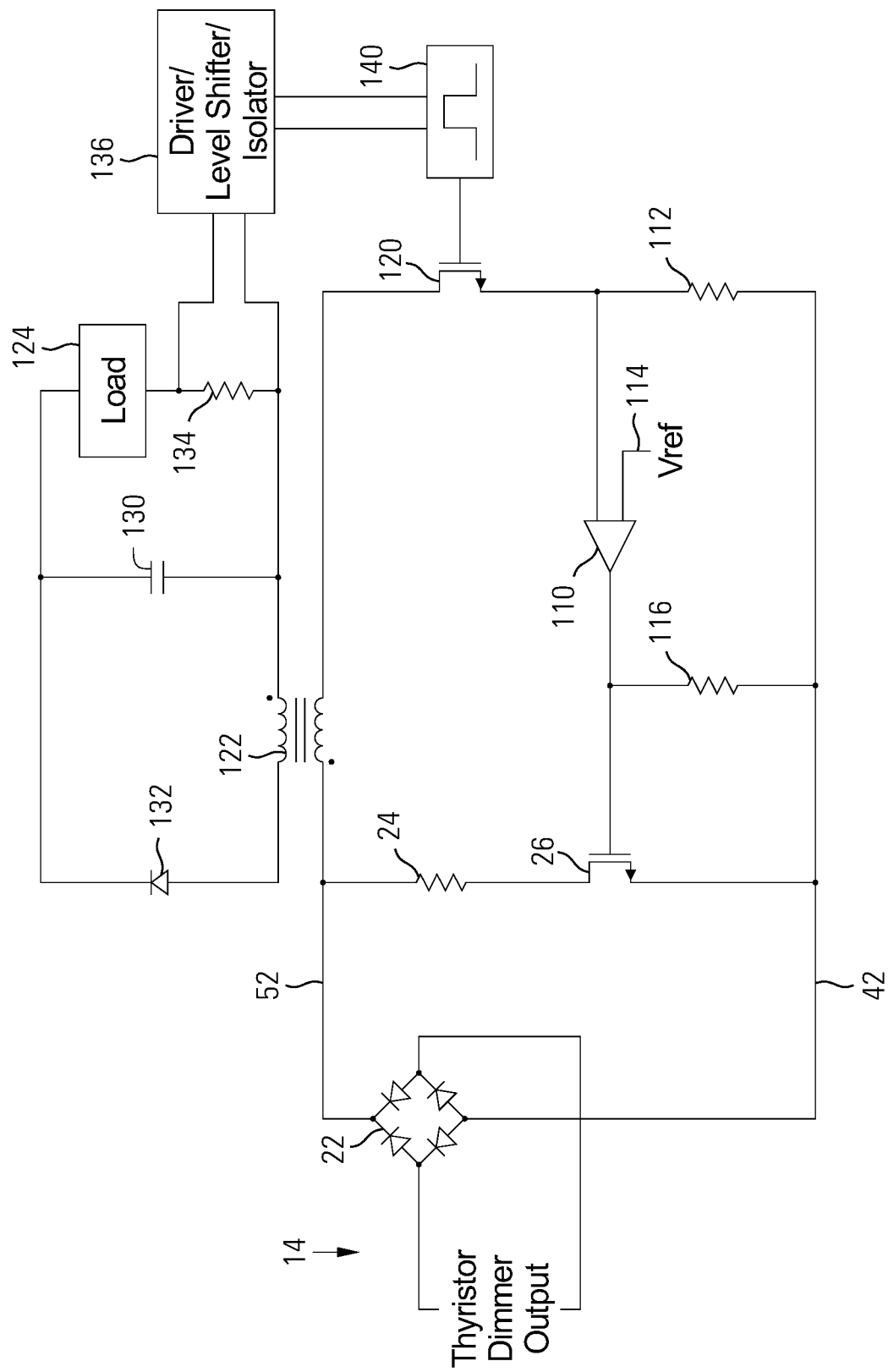
FIG. 17 is a schematic illustration of a thyristor starting circuit and/or controlled thyristor load circuit controlled via reference voltage and with a transformer-connected load.

A more specific embodiment is illustrated in FIG. 16. In this embodiment, the secondary of the transformer 122 provides power to the primary load 124, e.g., an LED, with the voltage to the load 124 conditioned as desired by elements such as capacitors 130 and diodes 132. The current through the load 124 may be measured across a sense resistor 134, or any other suitable feedback information may be used as desired, to control the transistor 120 providing power to the load 124 through the transformer 122. The feedback from the sense resistor 134 or other suitable source may be level shifted or isolated in a level shifting circuit 136, for example using an opto-isolator or opto-coupler. The level shifted feedback may be used by a pulse generator 140 or other control circuit to drive the gate of the transistor 120. The transistor 120 may be driven in any suitable manner to control the voltage and/or current to the load 124. As illustrated in FIG. 17, the driver or control circuitry used to control the transistor 120 may be referenced to either or both the primary or secondary winding of the transformer 122 as desired. In other words, the driver or control circuitry may be located in full or in part on either side of the level shifter 136. The driver or control circuitry may comprise any suitable circuitry for controlling the transistor 120, for example, such as an oscillator of any appropriate type, a pulse width modulation circuit, a pulse generator, a controlled pulse generator, or a microcontroller or microprocessor.

Figure 18:
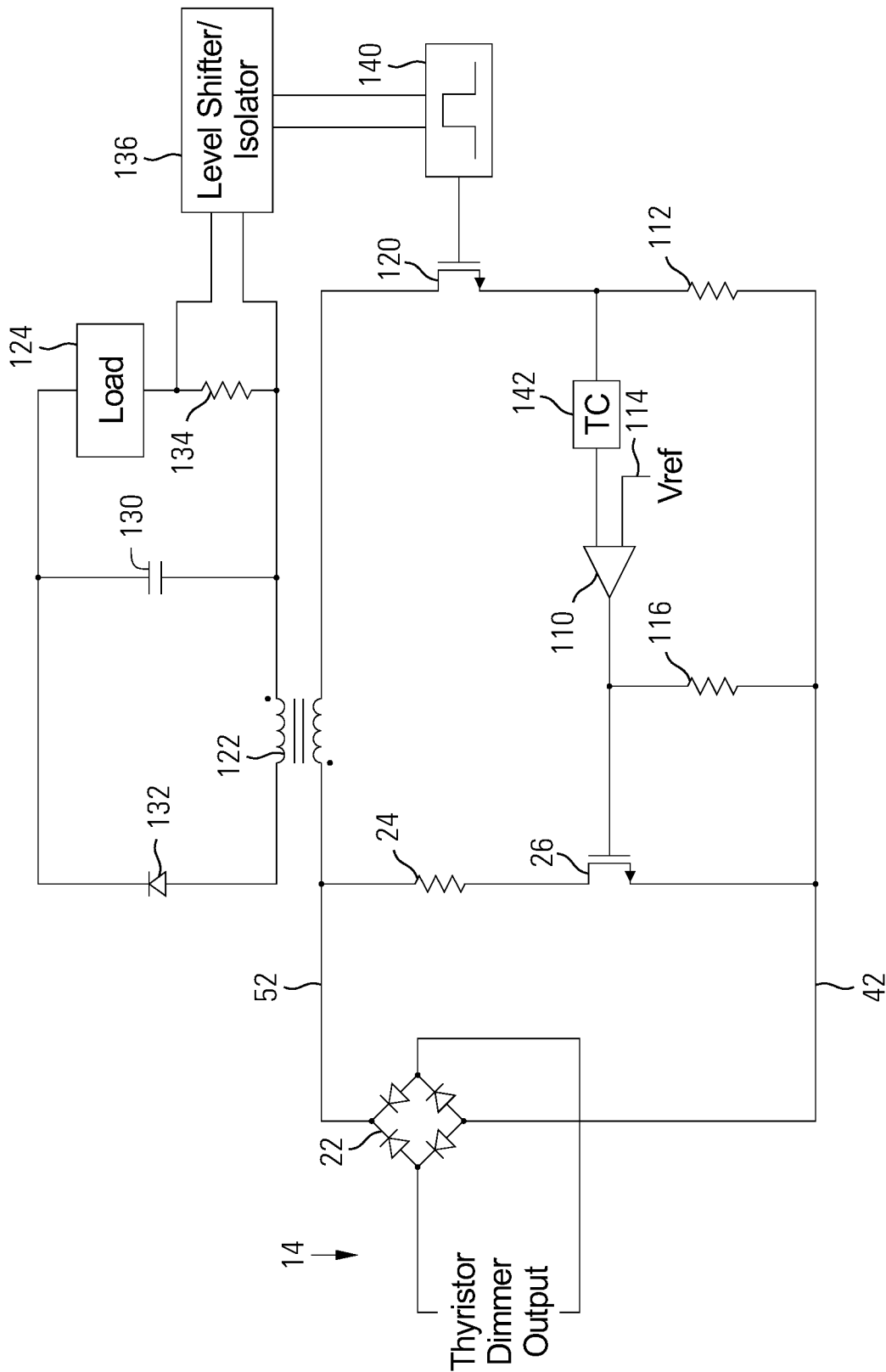
FIG. 18 is a schematic illustration of a thyristor starting circuit and/or controlled thyristor load circuit controlled via reference voltage and time constant and with a transformer-connected load.

Turning now to FIG. 18, the timing used to control the transistor 26 may be adapted using a time constant 142 applied using any suitable circuitry in any appropriate location of the circuit. For example, an RC network may be used at the input or output of the comparator 110 to control the timing of the transistor 26 state changes.

Figure 19:
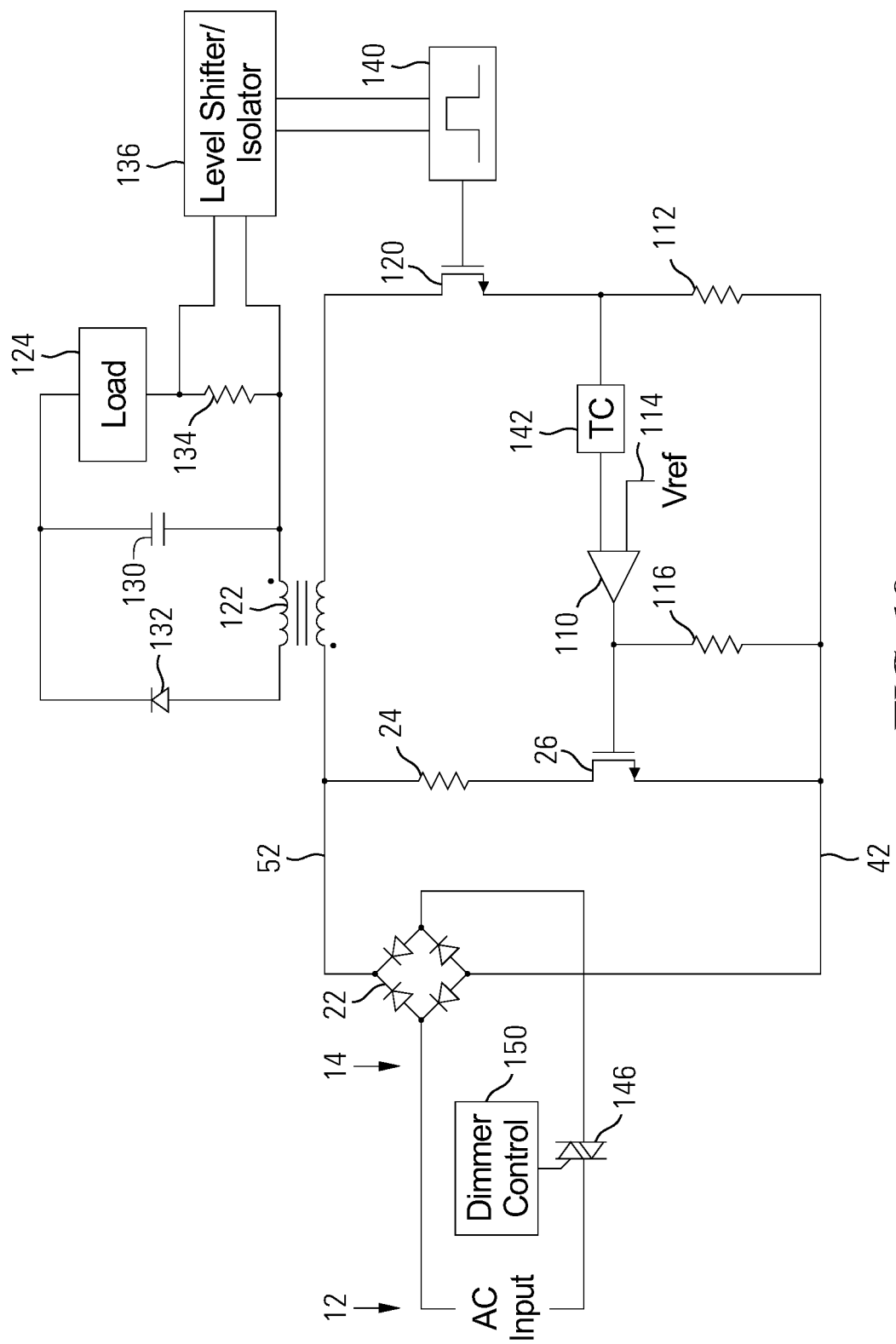
FIG. 19 is a schematic illustration of a thyristor starting circuit and/or controlled thyristor load circuit controlled via reference voltage and time constant and with a transformer-connected load.
Figure 20:
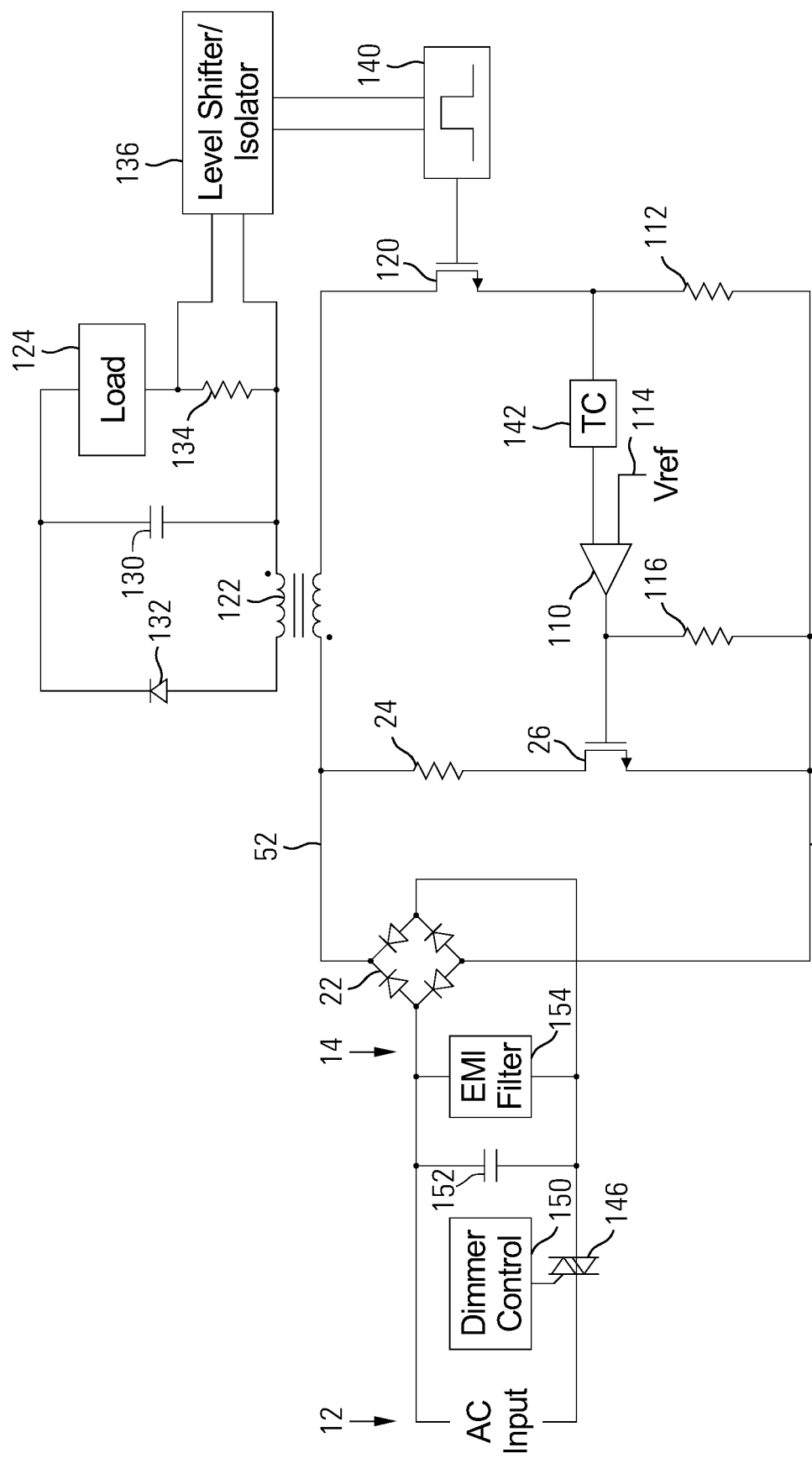
FIG. 20 is a schematic illustration of a thyristor starting circuit and/or controlled thyristor load circuit controlled via reference voltage and time constant and with a transformer-connected load.

The switchably connected secondary load 24 is not limited to use with any particular dimmer circuit. One embodiment is illustrated in FIG. 19, in which the voltage of an AC input 12 is varied by a TRIAC 146 or other type of thyristor, controlled by dimmer control circuitry 150. The secondary load 24 is switchably connected in series with the TRIAC 146 through a rectifier 22. As illustrated in FIG. 20, power conditioning capacitors 152 and EMI filters 154 may be included as desired.

Figure 21:
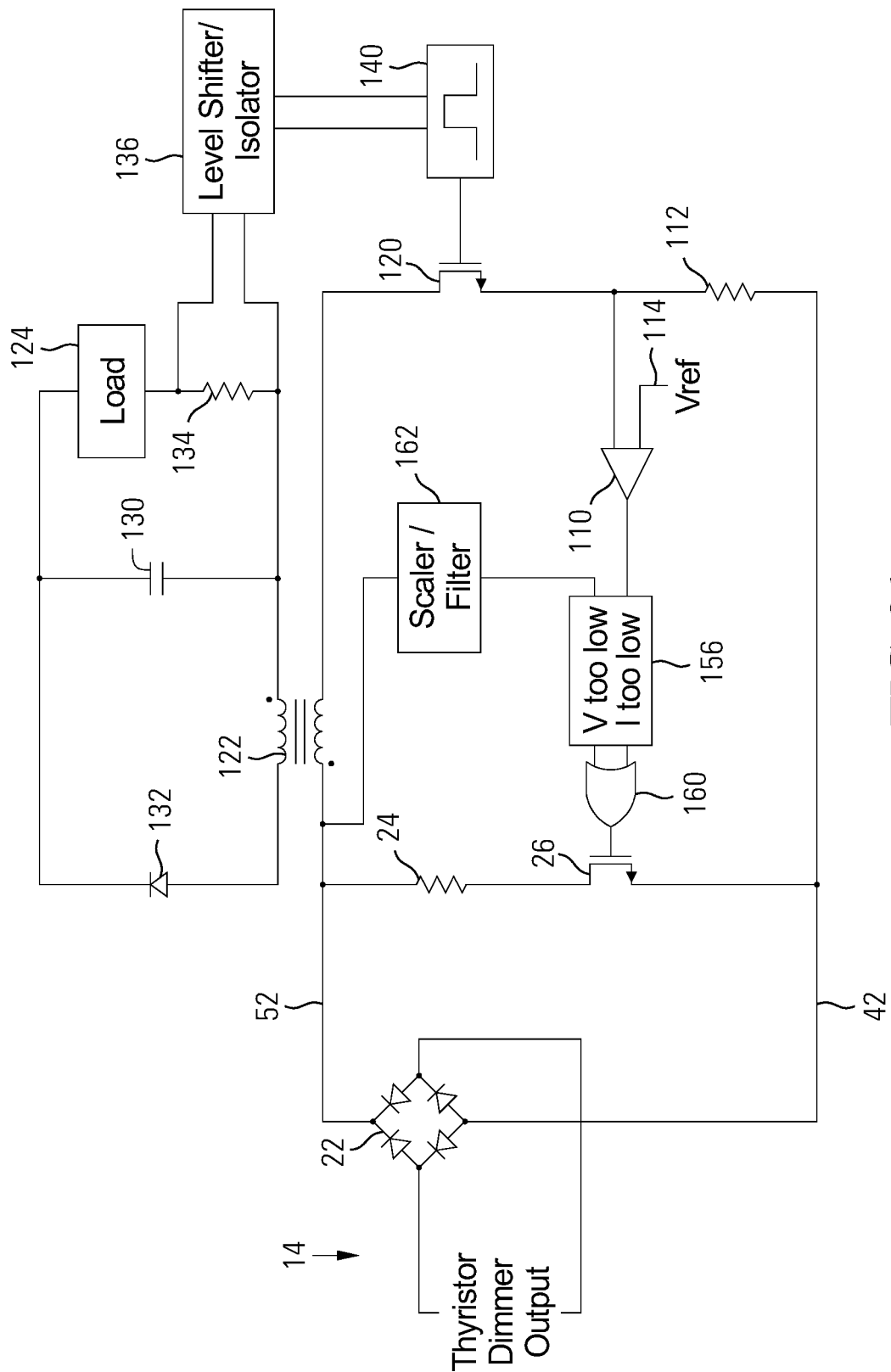
FIG. 21 is a schematic illustration of a thyristor starting circuit and/or controlled thyristor load circuit activated on low voltage or current and with a transformer-connected load.

In other embodiments analog and/or digital control circuits 156 make additional determinations about the state of voltage, current or other states in the system to control the transistor 26. For example, as illustrated in FIG. 21, the transistor 26 is controlled by an OR gate 160 connected to signals from the control circuits 156, a first indicating that the current is too low and a second indicating that the voltage is too low. If either condition is true, the OR gate 160 will turn on the transistor 26 and connect the secondary load 24. The inputs used by the control circuits 156 may be adapted as desired. For example, current conditions may be measured by the comparator 110 of previous embodiments or by a direct connection to the top of the sense resistor 112 with appropriate amplification and signal conditioning if needed. Voltage conditions at the rectified input 52 may be measured, scaled and filtered as desired by appropriate circuits 162.

Figure 22:
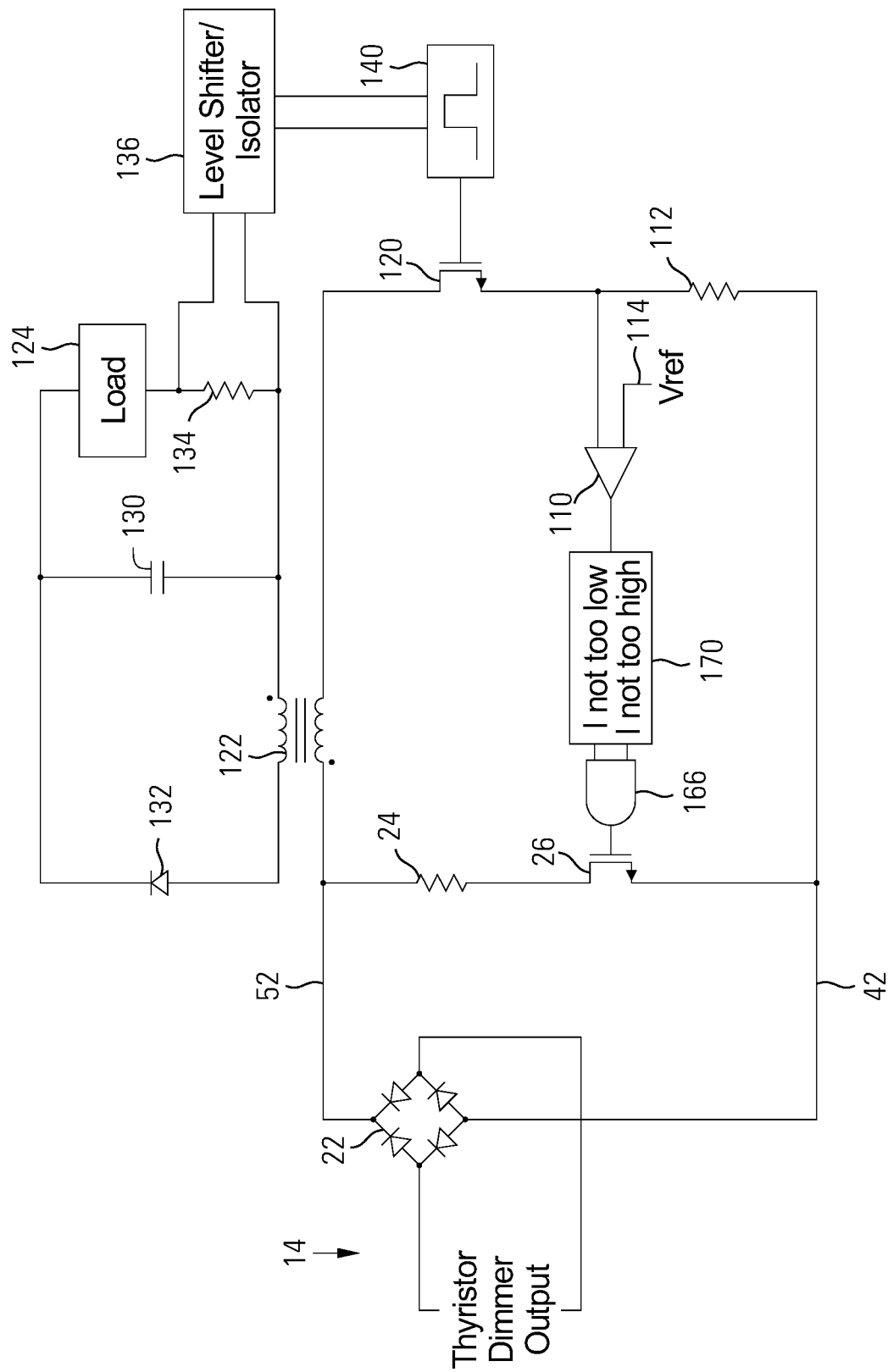
FIG. 22 is a schematic illustration of a thyristor starting circuit and/or controlled thyristor load circuit activated on high or low current and with a transformer-connected load.
Figure 23:
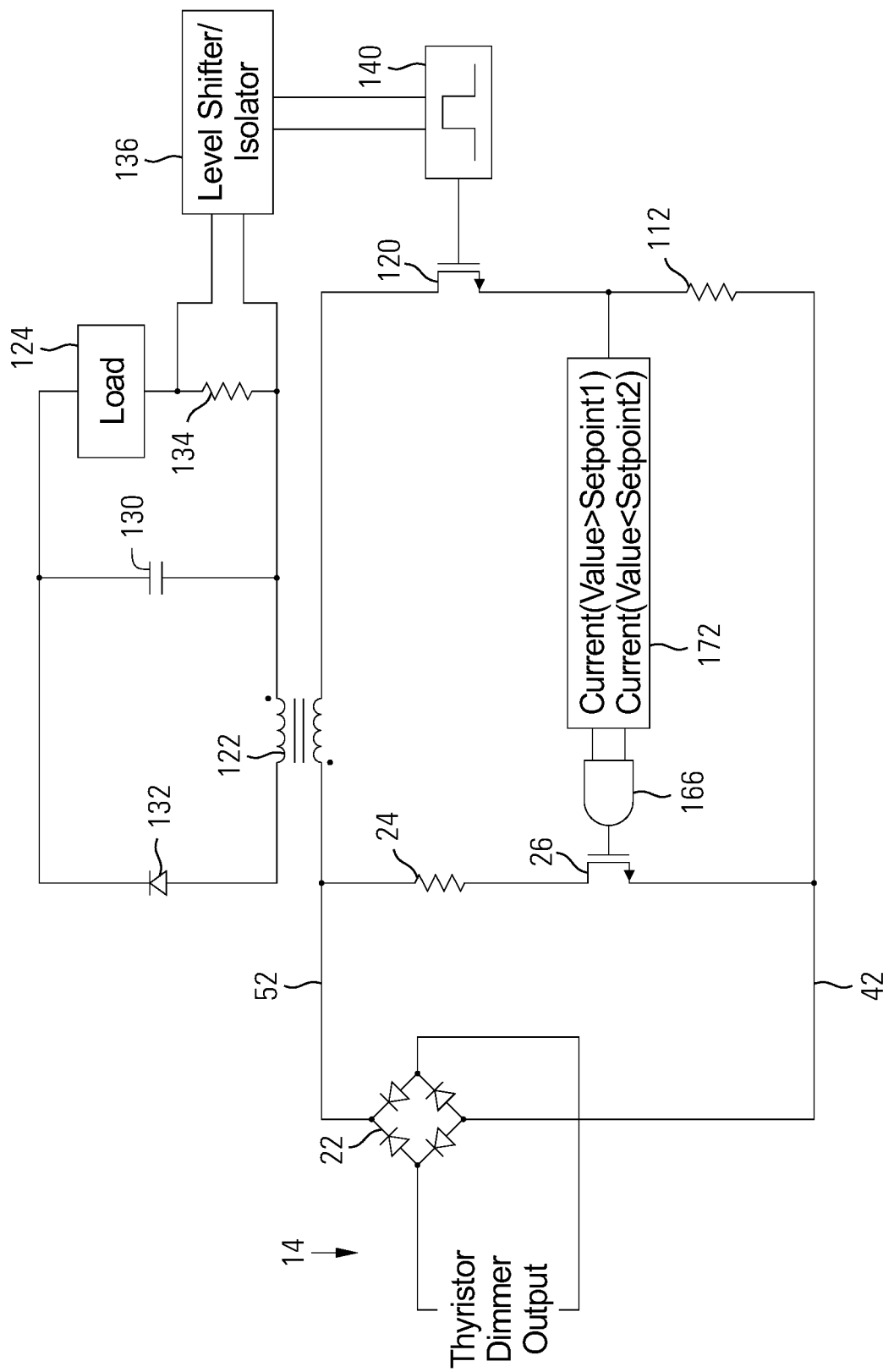
FIG. 23 is a schematic illustration of a thyristor starting circuit and/or controlled thyristor load circuit activated on high or low current and with a transformer-connected load.

As indicated above, the conditions used to switchably connect the secondary load 24 and the logic or other control circuitry used to detect and act on those conditions may be adapted as desired. For example, as illustrated in FIG. 22, the transistor 26 may be turned on by an AND gate 166 when current conditions measured by the comparator 110 are within a specified range, that is, not too high or too low as determined by comparator circuitry 170. As illustrated in FIG. 23, this may be implemented by ensuring that the current level is greater than a lower current setpoint (Setpoint1) and lower than an upper current setpoint (Setpoint2) as determined by comparator circuitry 172. Again, the current may be measured at any suitable point in the system and using any suitable device or circuit element. Such circuitry may also be used in part or in the same fashion to modulate or turn off the primary switching transistor to the primary load so as to eliminate any undesirable behavior, performance, etc. Also, the embodiments of the primary and secondary circuit including whether the circuit contains inductors and/or transformers and the numbers of inductors and/or transformers shown and contained within this document are meant to only be representative and not limiting in any way or form for the present invention. The present invention is not limited to any particular primary circuit topology and can be generally applied to single and multiple stage topologies including but not limited to buck, boost, buck-boost, boost-buck, CUK, forward, flyback, etc. and any combination of these and other circuit topologies or from any load that is unable to provide the proper load that the thyristor or related dimmer 10 or related circuit requires.

The circuitry used to detect and act on conditions in the system to switchably connect the secondary load 24 may include microcontrollers or microprocessors, Boolean logic such as inverters, AND, OR, NAND, NOR, XOR or other logic elements, comparators and/or op-amps. Product circuitry may be used, that is, for example, a multiplier which takes the product of input voltage and input current to determine if input power is too low. The circuitry may also include amplifiers such as instrumentation, summing, difference or error amplifiers. Log and antilog and log/antilog circuitry may be used. The circuitry may also include PID, adders, integrators and differentiators, etc. Hysteresis may also be incorporated in the circuitry used to detect and act on conditions in the system to switchably connect the secondary load 24.

Figure 24:
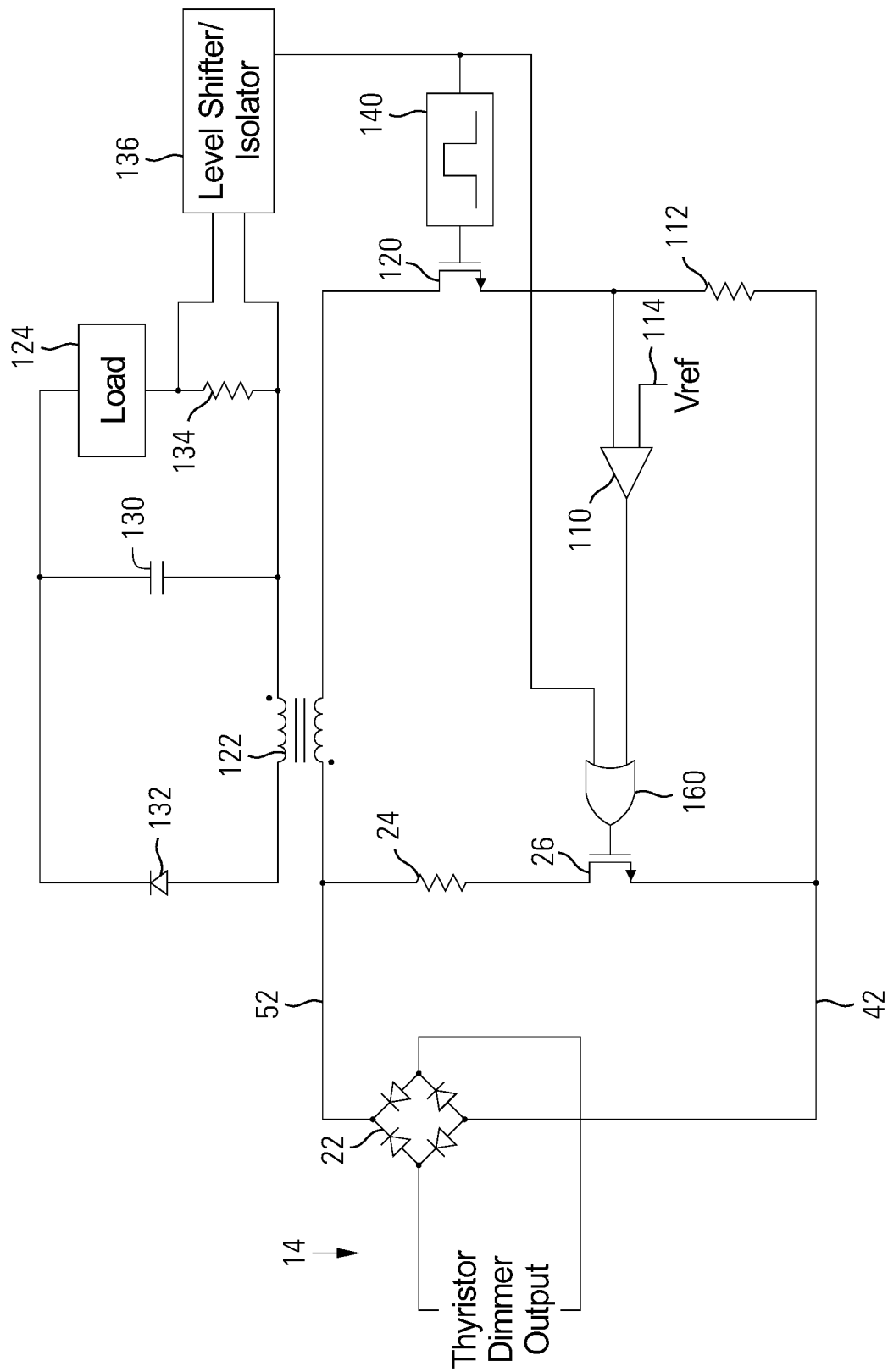
FIG. 24 is a schematic illustration of a thyristor starting circuit and/or controlled thyristor load circuit activated on low input current or low load current and with a transformer-connected load.

Referring now to FIG. 24, the switch 26 may also be controlled based on measurements of the voltage and/or current levels through a load 124, optionally in conjunction with measurements of the voltage and/or current levels at the rectified input 52. For example, in an embodiment with a transformer-connected load 124 as in FIG. 24, the current through the load 124 is measured using the sense resistor 134, the result is level-shifted by the level shifting circuit 136 such as an opto-isolator or opto-coupler, and the result is used to turn on the switch 26 as well as to control the pulse generator 140 and the current control transistor 120. In other embodiments, separate level shifting circuits 136 may be provided for these two functions. The voltage and/or current measurement through the load 124 may also optionally be combined with a voltage and/or current measurement at the rectified input 52 in an OR gate 160 as illustrated in FIG. 24, or the switch 26 may be controlled solely based on the load voltage and/or current by omitting the OR gate 160 and comparator 110.

Note that the schematics illustrated herein are simplified to describe the functionality of the invention, and may omit various signal conditioning, level shifting, biasing and scaling components etc. For example, various transistors, AND gates, OR gates etc. are illustrated without the biasing components that may be needed for logic levels at the inputs and outputs to be interpreted correctly. The specific additional components needed are based on the type of logic used in the circuits, the types of transistors and other components, etc, and are well understood in the art and will not be described in more detail herein.

Figure 25:
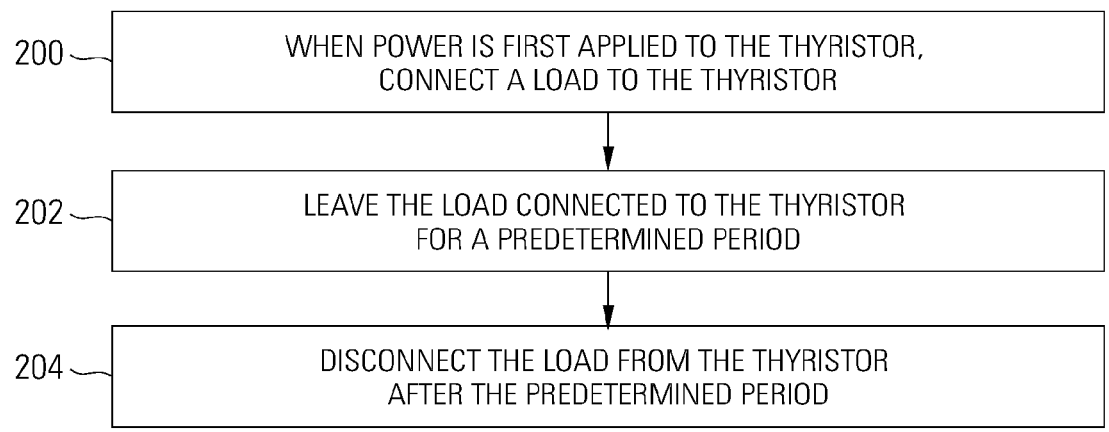
FIG. 25 is a flowchart of an example operation for starting a thyristor.

Referring now to FIG. 25, a method of starting a thyristor includes connecting a load to the thyristor when power is first applied to the thyristor (block 200), leaving the load connected to the thyristor for a predetermined period (block 202), and disconnecting the load from the thyristor after the predetermined period (block 204).

The apparatuses and methods for starting or igniting a thyristor and for connecting a load across a thyristor-based dimmer enable the use of efficient lighting technologies such as LED lights to be used with existing thyristor-based dimmers. The circuits may be embodied in lamp-base adaptors, in LED driver circuits or in any of a number of other convenient locations. The circuits may also be used with traditional incandescent lights or other loads to improve the behavior of the thyristor-based dimmer at low settings with low output voltage and/or current.

While illustrative embodiments have been described in detail herein, it is to be understood that the concepts disclosed herein may be otherwise variously embodied and employed. The configuration, arrangement and type of components in the various embodiments set forth herein are illustrative embodiments only and should not be viewed as limiting or as encompassing all possible variations that may be performed by one skilled in the art while remaining within the scope of the claimed invention.

What is claimed is:

1. An apparatus for controlling power to a load, the apparatus comprising:
    a thyristor;
    a secondary load switchably connected to an output of the thyristor; and
    a sensor connected to the secondary load, wherein the sensor is adapted to connect the secondary load to the thyristor when the output of the thyristor falls below a predetermined level, wherein the secondary load is switchably connected to the thyristor output by a transistor, wherein the sensor comprises:
    a resistor connected between the thyristor output and a control input of the transistor, and a second resistor connected between the control input of the transistor and a low voltage reference node;
    a Zener diode connected to the control input of the transistor;
    a second transistor having an input connected to the control input of the transistor;
    a third resistor connected between the thyristor output and a control input of the second transistor, and a fourth resistor connected between the control input of the second transistor and the low voltage reference node; and
    a second Zener diode connected to the control input of the second transistor.

2. The apparatus of claim 1, further comprising a lamp base, wherein the secondary load and sensor are located within the lamp base.

3. The apparatus of claim 1, wherein the secondary load comprises a resistor having a resistance below about 10 kilohms.

4. The apparatus of claim 1, wherein the secondary load comprises at least one member selected from the group consisting of a motor, a fan, an incandescent light, an electrical charger, and an air freshener.

5. The apparatus of claim 1, wherein the secondary load is switchably connected to the thyristor output by the second transistor.

6. The apparatus of claim 1, further comprising a delay element connected to the second transistor.

7. The apparatus of claim 6, wherein the delay element comprises a capacitor connected to the fourth resistor.

8. The apparatus of claim 1, wherein the secondary load remains connected to the output of the thyristor while the output of the thyristor remains below the predetermined level.

9. The apparatus of claim 1, wherein the transistor has a voltage rating based on a peak voltage at the output of the thyristor.

10. The apparatus of claim 1, wherein the Zener diode is operable to prevent a gate to source voltage on the transistor from rising above a maximum rated gate to source voltage for the transistor.

11. The apparatus of claim 1, wherein the secondary load is switchably connected to the output of the thyristor through a rectifier.

12. The apparatus of claim 1, wherein the secondary load is switchably connected to the output of the thyristor through a half-bridge rectifier.

13. The apparatus of claim 12, wherein the half-bridge rectifier comprises a pair of diodes.

14. The apparatus of claim 13, wherein the pair of diodes are oriented in a same direction.

15. The apparatus of claim 1, wherein the secondary load comprises an incandescent light.

16. The apparatus of claim 1, wherein the secondary load comprises a heater.

17. The apparatus of claim 1, wherein the secondary load comprises a resistor.

18. The apparatus of claim 1, wherein the third resistor and the fourth resistor have values selected to turn on the second transistor when the output of the thyristor is at a full power level.

19. The apparatus of claim 1, wherein the second transistor has a voltage rating based on a maximum gate voltage of the transistor.

20. The apparatus of claim 19, wherein the maximum gate voltage of the transistor is based on the Zener diode.

* * * * *